United States Patent
Tsai et al.

(10) Patent No.: US 9,252,079 B2
(45) Date of Patent: Feb. 2, 2016

(54) SUBSTRATE, METHOD OF FABRICATING THE SAME, AND APPLICATION THE SAME

(71) Applicant: Industrial Technology Research Institute, Hsinchu (TW)

(72) Inventors: Yao-Jun Tsai, Taoyuan County (TW); Chen-Peng Hsu, Hsinchu (TW); Shih-Yi Wen, Taipei (TW); Chi-Chin Yang, Hsinchu (TW); Hung-Lieh Hu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/472,391

(22) Filed: Aug. 29, 2014

(65) Prior Publication Data

US 2015/0061084 A1 Mar. 5, 2015

Related U.S. Application Data

(60) Provisional application No. 61/871,319, filed on Aug. 29, 2013.

(51) Int. Cl.
*H01L 21/00* (2006.01)
*H01L 29/00* (2006.01)
(Continued)

(52) U.S. Cl.
CPC .............. *H01L 23/481* (2013.01); *G02B 6/12* (2013.01); *G02B 6/34* (2013.01);
(Continued)

(58) Field of Classification Search
CPC ......... H01S 5/0208; H01S 5/026; H01S 5/34; H01S 5/02469; G02B 6/12; G02B 6/34; G02B 2006/12061; H01L 21/30604; H01L 21/76898; H01L 23/481; H01L 24/16; H01L 29/866; H01L 27/0255; H01L 33/20; H01L 33/62; H01L 2924/14; H01L 2924/1434; H01L 2924/12041; H01L 2924/12035; H01L 29/861; H01L 23/60; H01L 24/48; H01L 24/05; H01L 24/08; H01L 24/80; H01L 24/32; H01L 2924/12042; H01L 2924/01322; H01L 2924/00; H01L 2924/00014; H01L 2924/00; H01L 25/167; H01L 2224/83447; H01L 2224/08238; H01L 2224/32148; H01L 2224/80805; H01L 2224/80801; H01L 2224/0401; H01L 2224/04026; H01L 2224/04042; H01L 2224/05639; H01L 2224/05644; H01L 2224/05647; H01L 2224/061

See application file for complete search history.

(56) References Cited

U.S. PATENT DOCUMENTS 6,054,716 A  4/2000  Sonobe et al.
6,445,011 B1  9/2002  Hirano et al.
(Continued)

FOREIGN PATENT DOCUMENTS

CN  102610568  7/2012
TW  I260795  8/2006
(Continued)

OTHER PUBLICATIONS

Zhang Jian-Ming, et al., "High power and high reliability GaN/InGaN flip-chip light-emitting diodes," Chinese Physics, vol. 16, No. 4, Apr. 2007, pp. 1135-1139.
(Continued)

*Primary Examiner* — Nikolay Yushin
(74) *Attorney, Agent, or Firm* — Jianq Chyun IP Office

(57) ABSTRACT

Provided is a substrate, including a substrate material, two conductive structures, and at least one diode. The two conductive structures extend from a first surface of the substrate material to a second surface of the substrate material via two through holes penetrating through the substrate material. The at least one diode is embedded in the substrate material at a sidewall of one of the through holes.

16 Claims, 11 Drawing Sheets

(51) Int. Cl.

| | | |
|---|---|---|
| *H01L 23/48* | (2006.01) | |
| *H01L 21/306* | (2006.01) | |
| *H01L 27/02* | (2006.01) | |
| *H01L 33/20* | (2010.01) | |
| *H01L 33/62* | (2010.01) | |
| *H01L 21/768* | (2006.01) | |
| *H01L 23/00* | (2006.01) | |
| *H01S 5/02* | (2006.01) | |
| *H01S 5/024* | (2006.01) | |
| *H01S 5/026* | (2006.01) | |
| *H01S 5/34* | (2006.01) | |
| *G02B 6/12* | (2006.01) | |
| *G02B 6/34* | (2006.01) | |
| *H01L 29/861* | (2006.01) | |
| *H01L 23/60* | (2006.01) | |
| *H01L 25/16* | (2006.01) | |

(52) U.S. Cl.
CPC ..... *H01L 21/30604* (2013.01); *H01L 21/76898* (2013.01); *H01L 23/60* (2013.01); *H01L 24/16* (2013.01); *H01L 24/48* (2013.01); *H01L 27/0255* (2013.01); *H01L 29/861* (2013.01); *H01L 33/20* (2013.01); *H01L 33/62* (2013.01); *H01S 5/026* (2013.01); *H01S 5/0208* (2013.01); *H01S 5/02469* (2013.01); *H01S 5/34* (2013.01); *G02B 2006/12061* (2013.01); *H01L 24/05* (2013.01); *H01L 24/06* (2013.01); *H01L 24/08* (2013.01); *H01L 24/32* (2013.01); *H01L 24/80* (2013.01); *H01L 25/167* (2013.01); *H01L 2224/04* (2013.01); *H01L 2224/0401* (2013.01); *H01L 2224/04026* (2013.01); *H01L 2224/04042* (2013.01); *H01L 2224/05639* (2013.01); *H01L 2224/05644* (2013.01); *H01L 2224/05647* (2013.01); *H01L 2224/06102* (2013.01); *H01L 2224/08148* (2013.01); *H01L 2224/08238* (2013.01); *H01L 2224/16148* (2013.01); *H01L 2224/16238* (2013.01); *H01L 2224/29294* (2013.01); *H01L 2224/32148* (2013.01); *H01L 2224/32238* (2013.01); *H01L 2224/48091* (2013.01); *H01L 2224/48105* (2013.01); *H01L 2224/48148* (2013.01); *H01L 2224/48229* (2013.01); *H01L 2224/73265* (2013.01); *H01L 2224/80801* (2013.01); *H01L 2224/80805* (2013.01); *H01L 2224/81439* (2013.01); *H01L 2224/81444* (2013.01); *H01L 2224/81447* (2013.01); *H01L 2224/83439* (2013.01); *H01L 2224/83444* (2013.01); *H01L 2224/83447* (2013.01); *H01L 2224/85439* (2013.01); *H01L 2224/85444* (2013.01); *H01L 2224/85447* (2013.01); *H01L 2924/00014* (2013.01); *H01L 2924/01322* (2013.01); *H01L 2924/12035* (2013.01); *H01L 2924/12041* (2013.01); *H01L 2924/12042* (2013.01); *H01L 2924/14* (2013.01); *H01L 2924/1434* (2013.01); *H01L 2933/0066* (2013.01)

(56) References Cited

U.S. PATENT DOCUMENTS

| | | | |
|---|---|---|---|
| 7,883,910 | B2 | 2/2011 | Tsai et al. |
| 8,148,738 | B2 | 4/2012 | Murayama et al. |
| 8,217,416 | B2 | 7/2012 | Kim et al. |
| 8,283,729 | B2 | 10/2012 | Tsutsumi et al. |
| 8,310,043 | B2 | 11/2012 | Lin et al. |
| 2011/0309441 | A1 | 12/2011 | Stecher et al. |

FOREIGN PATENT DOCUMENTS

| | | |
|---|---|---|
| TW | I393238 | 4/2013 |
| TW | I430432 | 3/2014 |

OTHER PUBLICATIONS

J. J. Horng, et al., "GaN-Based Power LEDs With CMOS ESD Protection Circuits," IEEE Transactions on Device and Materials Reliability, vol. 7, No. 2, Jun. 2007, pp. 340-346.

N. C. Chen, et al., "Damage of light-emitting diodes induced by high reverse-bias stress," Journal of Crystal Growth, vol. 311, Issue 3, Jan. 15, 2009, pp. 994-997.

Shih-Chang Shei, et al., "Improved Reliability and ESD Characteristics of Flip-Chip GaN-Based LEDs With Internal Inverse-Parallel Protection Diodes," Electron Device Letters, IEEE, vol. 28, No. 5, May 2007, pp. 346-349.

Y.X. Sun, et al., "GaN-Based Power Flip-Chip LEDs With an Internal ESD Protection Diode on Cu Sub-Mount," IEEE Transactions on Advanced Packaging, vol. 33, No. 2, May 2010, pp. 433-437.

Juin J. Liou, "Challenges of Electrostatic Discharge (ESD) Protection in Silicon Nanowire Technology," Proc. 28th International Conference on Microelectronics (MIEL 2012), Niš, Serbia, May 13-16, 2012, pp. 11-13.

G. L. Pearson, et al., "Silicon P—N Junction Alloy Diodes," Proceedings of the IRE, Proceedings of the IRE, vol. 40, Issue 11, Nov. 1952, pp. 1348-1351.

SUBSTRATE, METHOD OF FABRICATING THE SAME, AND APPLICATION THE SAME

CROSS-REFERENCE TO RELATED APPLICATION

This application claims the priority benefits of U.S. provisional application Ser. No. 61/871,319, filed on Aug. 29, 2013. The entirety of the above-mentioned patent application is hereby incorporated by reference herein and made a part of this specification.

TECHNICAL FIELD

The present disclosure relates to a substrate, a method of fabricating the same and an application the same, and more particularly, relates to a substrate having a diode, a method of fabricating the same and an application the same.

BACKGROUND

With continuous development of new technologies, mobile devices these days have increasing demands for compact size, which lead to a trend of making electronic devices applied in the mobile devices smaller. However, when electro-static discharge (ESD) occurs, the electronic devices are under influences of a sudden large current generated from ESD, such that a system to which the electronic devices belong may crash or suffer permanent damages.

In conventional technical field of ESD protection, an ESD protection device is often disposed on a path where the ESD may occur based on different modes, so as to disperse the current generated in ESD. However, the ESD protection device may lead to increases of chip areas. As a result, in addition to the burden on manufacturing costs, it also runs in the opposite direction to the trend of creating the electronic products with compact size.

SUMMARY

The present disclosure provides a substrate, which includes a substrate material, two conductive structures and at least one diode. The two conductive structures extend from a first surface of the substrate material to a second surface of the substrate material via two through holes penetrating through the substrate material. The at least one diode is embedded in the substrate material at a sidewall of one of the through holes.

The present disclosure provides a method of fabricating a substrate, which includes the following steps. A substrate material of a first conductive type is provided. Two through holes are formed in the substrate material, and each of the through holes penetrates through the substrate material. At least one diode is embedded in the substrate material exposed by one of the through holes. Two conductive structures are formed in the substrate material. The two conductive structures extend from a first surface of the substrate material to a second surface of the substrate material via the through holes penetrating through the substrate material.

The present disclosure provides a package structure, which includes aforesaid substrate and a chip. The chip is disposed on the substrate. The chip is electrically connected to the substrate.

To make the above features and advantages of the present disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION

Figure 1A:
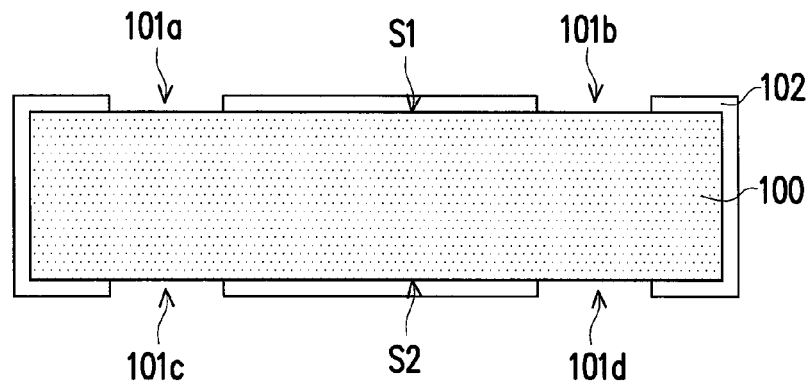
FIG. 1A to FIG. 1E are cross-sectional views illustrating a process of fabricating a substrate according to a first embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In the following embodiments, when the first conductivity type is an N-type, the second conductivity type is a P-type; and when the first conductivity type is the P-type, the second conductivity type is the N-type. The present embodiment is illustrated by using the first conductivity type as the P-type and the second conductivity type as the N-type for example, but the present disclosure is not limited thereto. A P-type dopant is, for example, boron; an N-type dopant is, for example, phosphorous or arsenic.

FIG. 1A to FIG. 1E are cross-sectional views illustrating a process of fabricating a substrate according to a first embodiment of the present disclosure.

Referring to FIG. 1A, first, a substrate material 100 is provided. A material of the substrate material 100 is, for example, a semiconductor substrate, or a semiconductor compound substrate. The semiconductor substrate is, for example, atoms of group IVA, such as silicon or germanium.

The semiconductor compound is, for example, a semiconductor compound formed by atoms of group IVA, such as silicon germanium or silicon carbide, or a semiconductor compound formed by atoms of group IIIA and group VA (e.g., gallium arsenide). In an embodiment, the substrate material 100 may be, for example, the substrate material 100 of the first conductivity type. The first conductivity type may be the P-type for example, but the present disclosure is not limited thereto.

Next, a patterned insulation layer 102 is formed on the substrate material 100. Specifically, an insulation layer (not illustrated) is formed on the substrate material 100. The insulation layer covers a first surface S1, a second surface S2 and two lateral sides of the substrate material 100. Then, a patterning process is performed on the insulation layer in order to form the patterned insulation layer 102. The patterned insulation layer 102 includes a plurality of openings 101a, 101b, 101c, and 101d. The openings 101a and 101b expose the first surface S1 of the substrate material 100. The openings 101c and 101d expose the second surface S2 of the substrate material 100. A position of the opening 101a is corresponding to a position of the opening 101c; and a position of the opening 101b is corresponding to a position of the opening 101d. A material of the insulation layer may be, for example, a silicon oxide, a silicon nitride, a silicon oxynitride or a combination thereof, and a forming method thereof includes a chemical vapor deposition. In an embodiment, a thickness of the insulation layer is 100 nm to 3000 nm.

Figure 1B:
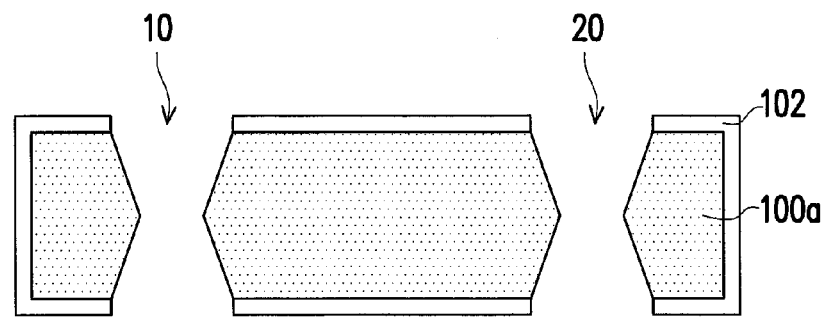

Referring to FIG. 1B, an isotropic etching process is performed on the substrate material 100 by using the patterned insulation layer 102 as a mask in order to form a substrate material 100a having at least two through holes 10 and 20. In an embodiment, the isotropic etching process may be, for example, a wet etching process which is performed by using an etchant such as KOH, NaOH, $NH_4OH$ or $H_3PO_4$, and the like. Specifically, the etchant used in the isotropic etching process has a high etching ratio with respect to the patterned insulation layer 102 and the substrate material 100. Therefore, when the etchant is in contact with the substrate material 100 exposed by the openings 101a, 101b, 101c, and 101d, a part of the substrate material 100 between the opening 101a and the corresponding opening 101c is removed to form the through hole 10. Similarly, a part of the substrate material 100 between the opening 101b and the corresponding opening 101d is removed to form the through hole 20.

Figure 2A:
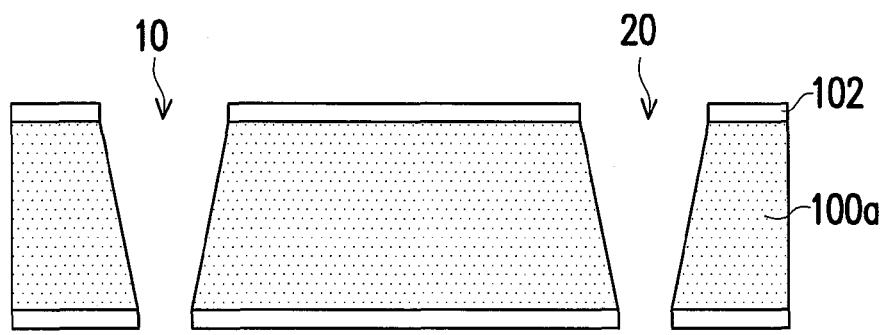
FIG. 2A is a cross-sectional view illustrating a shape of the through hole according to an embodiment of the present disclosure.
Figure 2B:
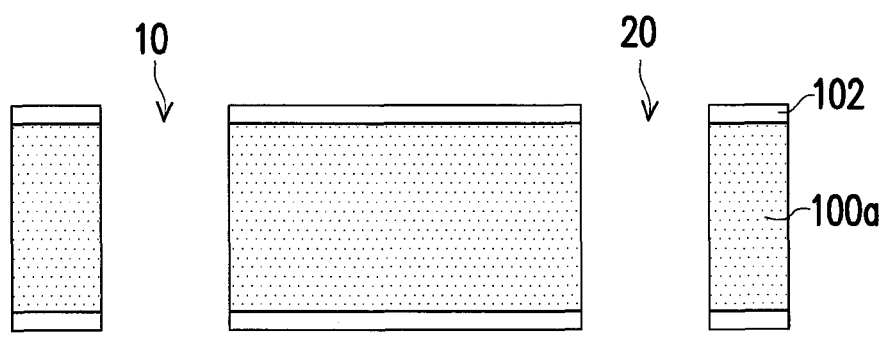
FIG. 2B is a cross-sectional view illustrating a shape of the through hole according to another embodiment of the present disclosure.
Figure 2C:
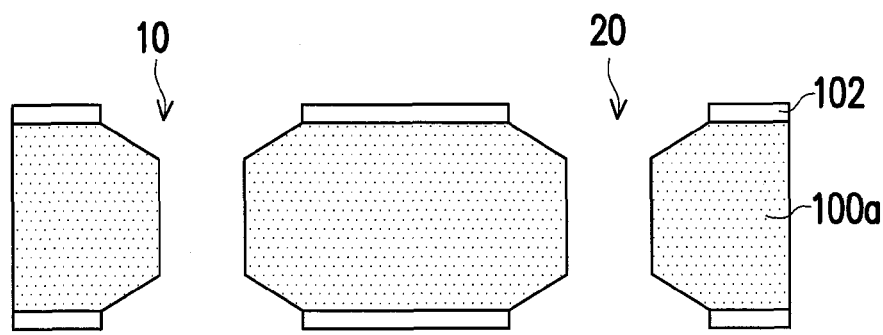
FIG. 2C is a cross-sectional view illustrating a shape of the through hole according to yet another embodiment of the present disclosure.

Further, by controlling an etch recipe of the isotropic etching process, shapes of two sidewalls of the through holes 10 and 20 may be various shapes. Contours of the through holes 10 and 20 may be adjusted based on demands of different devices, which are not particularly limited in the present disclosure. For instance, the through hole (10, 20) is suitable for a light-emitting diode (LED) manufacturing process if the contour is an hourglass shape (as shown in FIG. 1B), or an inverse trapezoid shape (as shown in FIG. 2A), or a bow tie shape (as shown in FIG. 2C). The through hole (10, 20) is suitable for a 3D IC manufacturing process if the shapes of the two sidewalls is an I-shape (as shown in FIG. 2B).

Figure 1C:
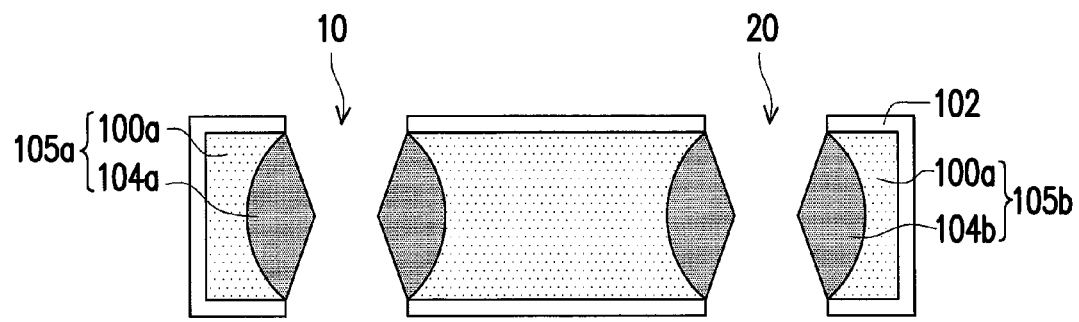

Referring to FIG. 1C, a doping process is performed on the two sidewalls of the through hole (10, 20), so as to form a first doped region (104a, 104b) of the second conductivity type in a substrate material 100a. The first doped region (104a, 104b) may be, for example, located in the substrate material 100a at the two sidewalls of the through hole (10, 20). The doping process may be performed by a process using a high temperature tube furnace for example. In an embodiment, a dopant in the substrate material 100a is, for example, boron; and a dopant implanted in the first doped region (104a, 104b) is, for example, phosphorous or arsenic.

Figure 3A:
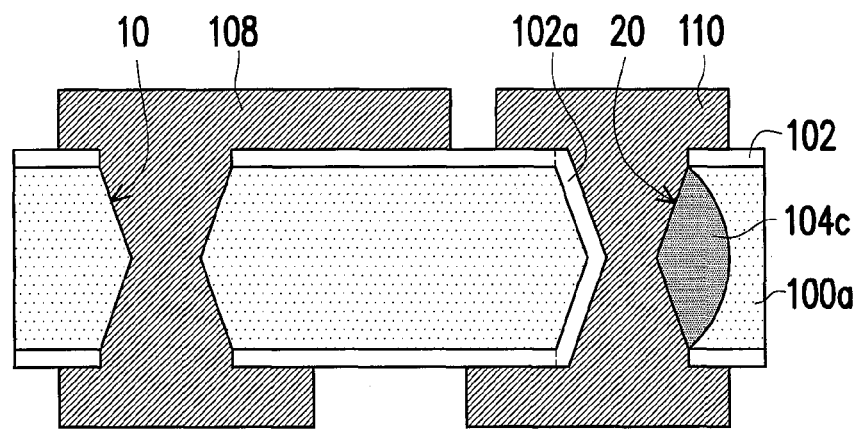
FIG. 3A to FIG. 3E are cross-sectional views of the substrates according to various embodiments of the present disclosure.
Figure 3B:
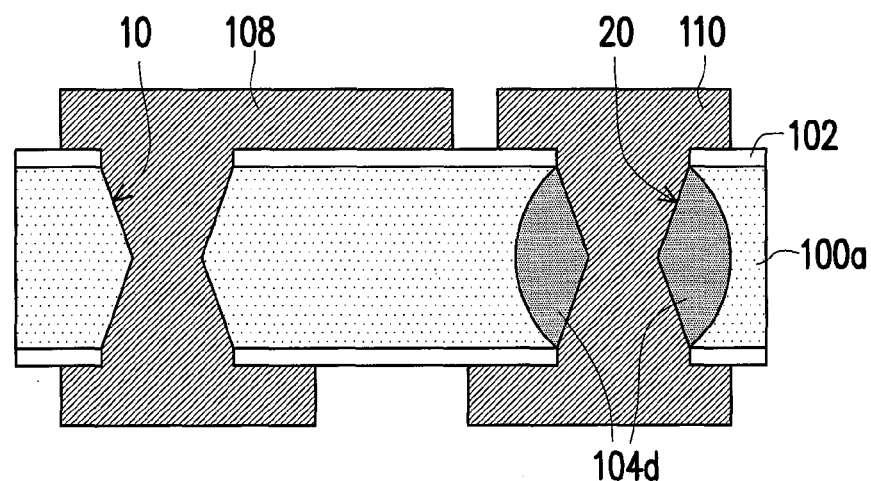
Figure 3C:
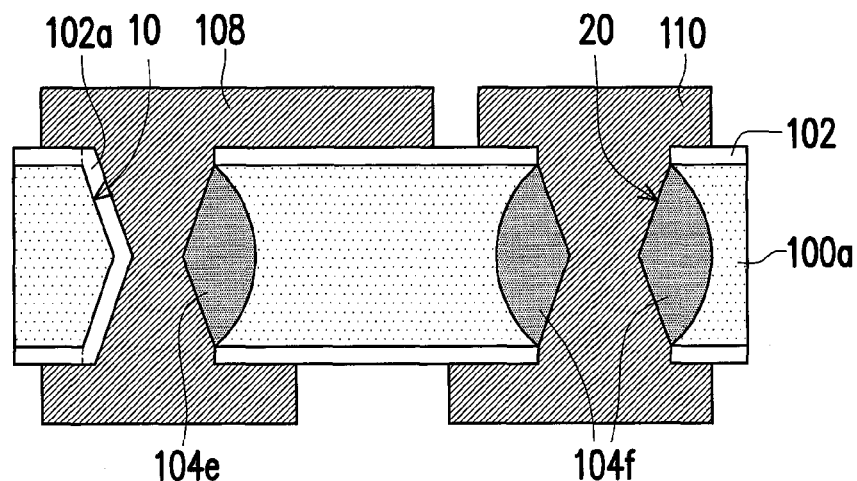
Figure 3D:
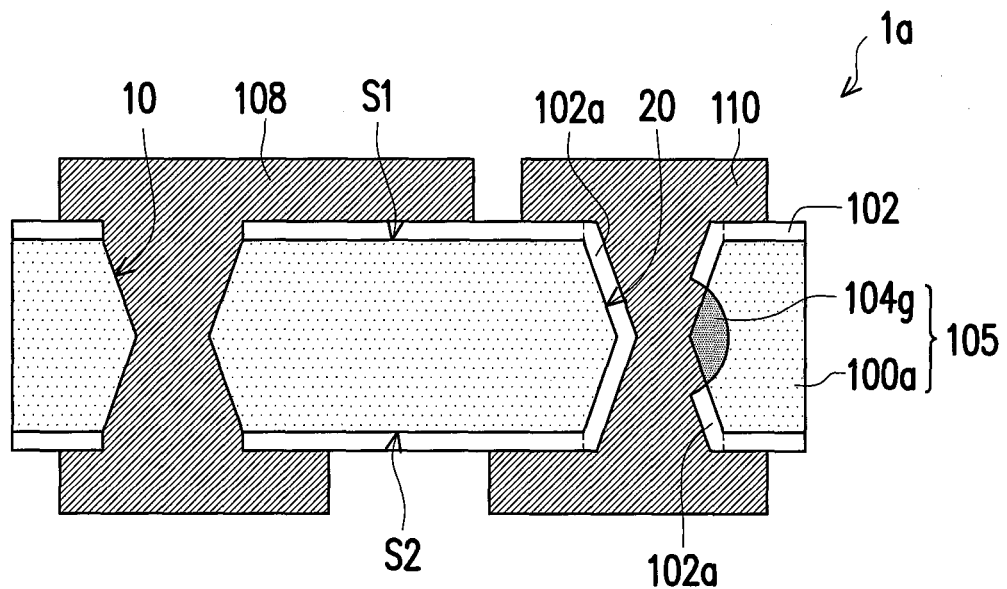
Figure 3E:
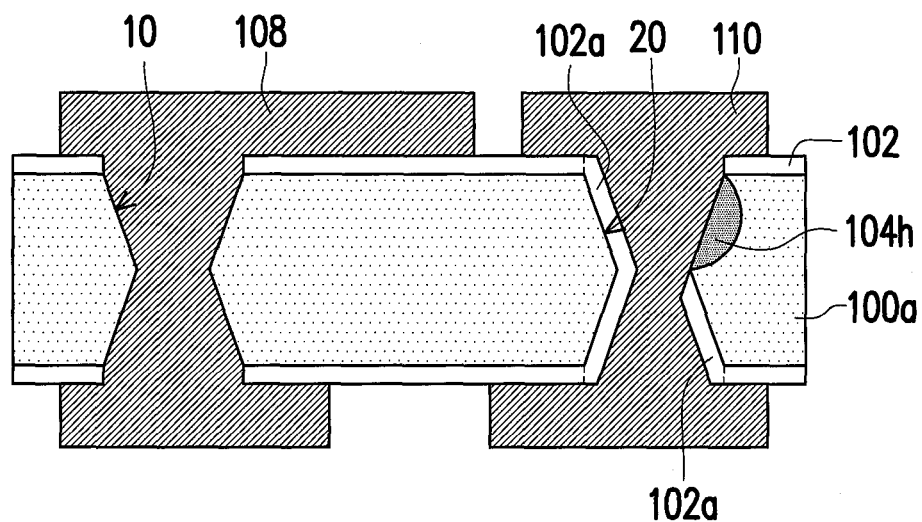

Referring to FIG. 3A to FIG. 3E, detailed descriptions regarding the first doped region according to various embodiments of the present disclosure are provided as follows. A first doped region 104c may be located in the substrate material 100a at one of the sidewalls of the through hole 20 (as shown in FIG. 3A) for example, whereas an insulation structure 102a is provided at another one of the sidewalls of the through hole 20. Further, a first doped region 104d may be located in the substrate material 100a at the two sidewalls of the same through hole 20 (as shown in FIG. 3B). A first doped region 104e may also be disposed at least one of the sidewalls of the through hole 10 and located together with a first doped region 104f in the substrate material 100a at the two sidewalls of the same through hole 20 (as shown in FIG. 3C). When the first doped region 104e is located in the substrate material 100a at one of the sidewalls of the through hole 10, the insulation structure 102a is provided at another one of the sidewalls of the through hole 10. In addition, a first doped region (104g, 104h) may be located in a part of the substrate material 100a at a sidewall of the through hole 20 (as shown in FIG. 3D and FIG. 3E), which can be decided based on demands. However, the present disclosure is not limited by the above. When the first doped region (104g, 104h) is located in the substrate material 100a at the part of one of the sidewalls of the through hole 20, the insulation structure 102a is provided at other parts of the one of the sidewalls of the through hole 20 and another one of the sidewalls of the through hole 20.

In the embodiments corresponding to FIG. 3A to FIG. 3E, for making the first doped region (104c, 104d, 104e, 104f, 104g or 104h) to locate only at one of the through holes 10 and 20 or to locate in the substrate material 100a at a part of the sidewall of one of the through holes 10 and 20, a patterned mask layer (not illustrated) may be formed on the two sidewalls of the through holes 10 and 20 in advance before preforming the doping process. Thereafter, the doping process may be performed by using the patterned mask layer and the patterned insulation layer 102 as a mask. The doping process is, for example, an ion implantation process or a high temperature diffusion doping process. If the doping process is performed by using the high temperature diffusion doping process, a thin oxidation layer formed at the sidewall of the through hole when doping with high temperature may be removed by using a hydrofluoric acid (HF) or a dry etching method.

Referring back to FIG. 1C, a diode 105a is constituted by the first doped region 104a and a part of the substrate material 100a nearby; and a diode 105b is constituted by the first doped region 104b and a part of the substrate material 100a nearby. In other words, the diodes 105a and 105b are embedded in the substrate material 100a. The diodes 105a and 105b have the function of the Zener diode, and can be used as the ESD protection device in a subsequent packaging process for preventing the electronic device from influences by the great voltage generated from electro-static discharge which damages the device.

Figure 1D:
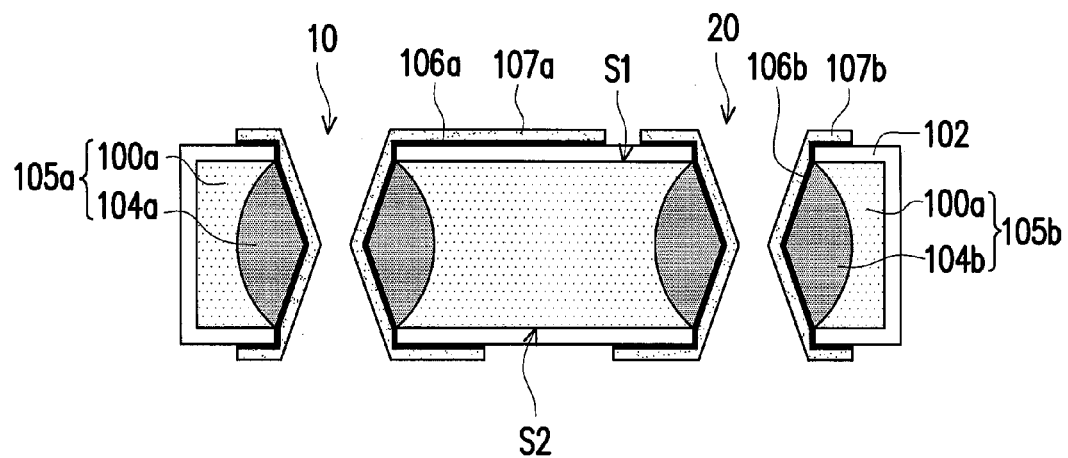

Referring to FIG. 1D, a patterned seed layer (107a, 107b) is formed on the two sidewalls of the through hole (10, 20). Specifically, a seed layer (not illustrated) is formed on the two sidewalls of the through hole (10, 20) and a part of the patterned insulation layer 102 on the first surface S1 and the second surface S2. Then, a patterning process is performed on the seed layer to expose a part of the patterned insulation layer 102 in order to form the patterned seed layer (107a, 107b). The patterned seed layer 107a covers the two sidewalls of the through hole 10 and the part of the patterned insulation layer 102 on the first surface S1 and the second surface S2. The patterned seed layer 107b covers the two sidewalls of the through hole 20 and the part of the patterned insulation layer 102 on the first surface S1 and the second surface S2. The patterned seed layers 107a and 107b are separated from each other in order to prevent short circuit of the electronic device due to an anode electrically connecting to a cathode in a chip during the subsequent packaging process. In an embodiment, a material of the seed layer may be, for example, a metal material. The metal material may be, Au, Ag, Cu or a combination thereof. A forming method of the seed layer includes an E-beam evaporation, a sputtering or an electro-plating. In an embodiment, a thickness of the seed layer is 10 nm to 10000 nm.

Further, in an embodiment, a barrier layer (106a, 106b) may be provided between the patterned seed layer (107a, 107b) and the substrate material 100a in order to prevent the metal atom of the patterned seed layer (107a, 107b) from being diffused into the substrate material 100a. A material of the barrier layer (106a, 106b) may be, for example, a metal or a metal nitride. The metal or the metal nitride may be, for example, Ni, Pt, Ti, TiN, TaN, W, TiW or a combination thereof. The barrier layer may be formed by using an E-beam evaporation, a sputtering, an electro-plating, or a chemical vapor deposition. The material of the patterned seed layer (107a, 107b) may cooperate with the material of the barrier layer (106a, 106b) in order to obtain a most preferable barrier effect. For instance, when the material of the seed layer (107a, 107b) is Au, the material of the barrier layer (106a, 106b) may adopt Ni, Pd, Pt or Ti; when the material of the seed layer (107a, 107b) is Ag, the material of the barrier layer (106a, 106b) may adopt TiN or TaN; and when the material of the seed layer (107a, 107b) is Cu, the material of the barrier layer (106a, 106b) may adopt W, TiW or Ti. However, the present disclosure is not limited by the above. In an embodiment, it is also possible that aforesaid barrier layer (106a, 106b) is not provided between the patterned seed layer (107a, 107b) and the substrate material 100a.

Figure 1E:
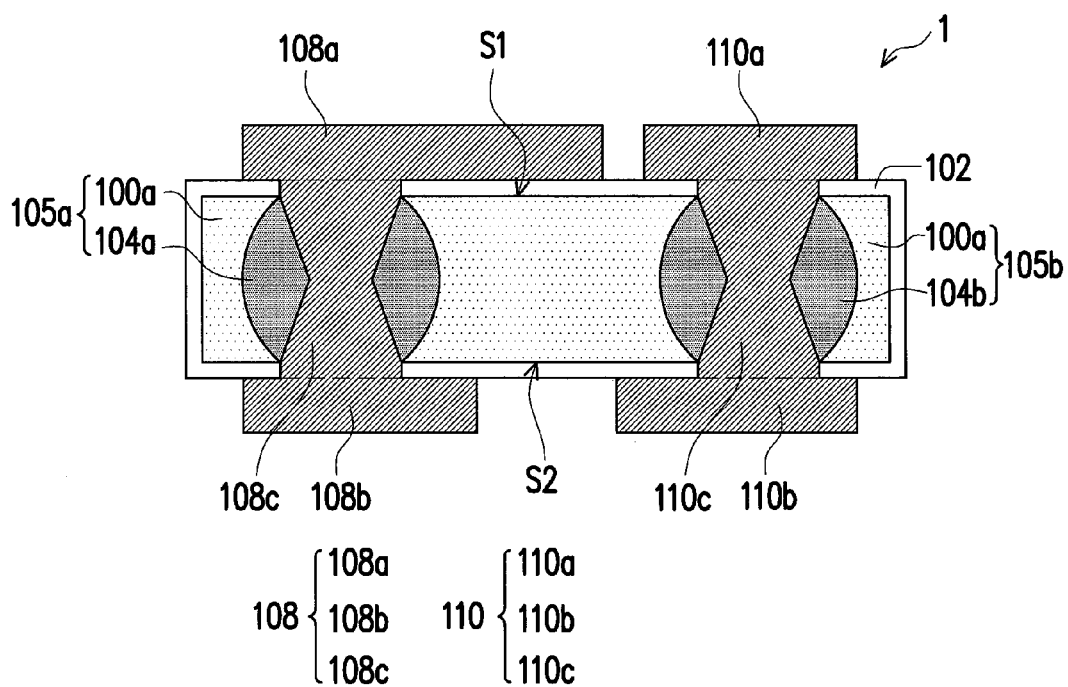

Referring to FIG. 1E, a conductive structure 108 and a conductive structure 110 are formed. The conductive structure 108 includes a first electrode 108a, a second electrode 108b and a connecting portion 108c. The connecting portion 108c penetrates the substrate material 100a to electrically connect the first electrode 108a to the second electrode 108b. Similarly, the conductive structure 110 includes a first electrode 110a, a second electrode 110b and a connecting portion 110c. The connecting portion 110c penetrates the substrate material 100a to electrically connect the first electrode 110a to the second electrode 110b. The conductive structure 108 and the conductive structure 110 are electrically isolated from each other in order to prevent short circuit of the electronic device due to the anode of the chip electrically connecting to the cathode of the chip during the subsequent packaging process. In addition, the first electrode (108a, 110a) and the second electrode (108a, 110a) need to include a sufficient thickness in order to sustain an amount of current provided by the electronic device (approximately 0.02 A to 20 A), so as to prevent the electronic device from damages caused by the current being overly large. In an embodiment, a material of the conductive structure (108, 110) may be a metal material. The metal material may be, Au, Ag, Cu or a combination thereof. A forming method of the conductive structure includes an electro-plating, an evaporation or a coat printing. In an embodiment, a thickness of the first electrode (108a, 110a) is 1 μm to 100 μm. A thickness of the second electrode (108b, 110b) is 1 μm to 100 μm.

FIG. 1E is the cross-sectional view of the substrate according to the first embodiment of the present disclosure.

Referring to FIG. 1E, a substrate 1 according to the first embodiment of the present disclosure includes the substrate material 100a, the patterned insulation layer 102, the two diodes 105a and 105b, and the two conductive structures 108 and 110. The two conductive structures 108 and 110 extend from the first surface S1 of the substrate material 100a to the second surface S2 via the through holes 10 and 20 penetrating through the substrate material 100a. The conductive structure 108 includes the first electrode 108a, the second electrode 108b and the connecting portion 108c. The conductive structure 110 includes the first electrode 110a, the second electrode 110b and the connecting portion 110c. Each of the first electrodes 108a and 110a is disposed on the first surface S1 of the substrate material 100a. Each of the second electrodes 108b and 110b is disposed on the second surface S2 of the substrate material 100a. The connecting portion 108c is disposed between the first electrode 108a and the second electrode 108b to electrically connect the first electrode 108a to the second electrode 108b. The connecting portion 110c is disposed between the first electrode 110a and the second electrode 110b to electrically connect the first electrode 110a to the second electrode 110b. The patterned insulation layer 102 is disposed on the first surface S1 of the substrate material 100a, and located between the substrate material 100a and the first electrode 108a, and between the substrate material 100a and the first electrode 110a. The patterned insulation layer 102 is further disposed on the second surface S2 of the substrate material 100a, and located between the substrate material 100a and the second electrode 108b, and between the substrate material 100a and the second electrode 110b. The patterned insulation layer 102 electrically isolates the substrate material 100a from the first electrodes 108a and 110a and the second electrodes 108b and 110b.

Each of the diodes 105a and 105b is embedded in the substrate material 100a. The diode 105a is in contact with the connecting portion 108c of the conductive structure 108, and the diode 105b is in contact with the connecting portion 110c of the conductive structure 110. The diode 105a includes a part of the substrate material 100a of the first conductivity type and the first doped region 104a of the second conductivity type. The diode 105b includes a part of the substrate material 100a of the first conductivity type and the first doped region 104b of the second conductivity type. The first doped region 104a is located in the substrate material 100a and in contact with the connecting portion 108c of the conductive structure 108. The first doped region 104b is located in the substrate material 100a and in contact with the connecting portion 110c of the conductive structure 110. Among various embodiments, a position and an amount of the first doped region includes various possibles (as shown in FIG. 3A to FIG. 3E) which is based on demands. However, the present disclosure is not limited by the above. For instance, as shown in FIG. 3D, the first doped region 104g of a substrate 1a is located in a part of the substrate material 100a at a sidewall of the through hole 20. Contours of the connecting portions 108c and 110c may be a hourglass shape, an I-shape, an inverse trapezoid shape, or a bow tie shape (as shown in FIGS. 1B, 2A, 2B and 2C respectively). The contours of the connecting portions 108c and 110c may be adjusted based on demands of different devices, which are not particularly limited in the present disclosure.

In the following embodiments, identical or similar devices, members and layers are indicated by similar reference numbers. For instance, the patterned insulation layer 102 has components identical or similar to components in patterned insulation layers 202, 302, 402, 502, 602; and the conductive structure 108 has components identical or similar to components in conductive structures 208, 308, 408, 508, 608. Hence, related descriptions are not repeated hereinafter.

Figure 4A:
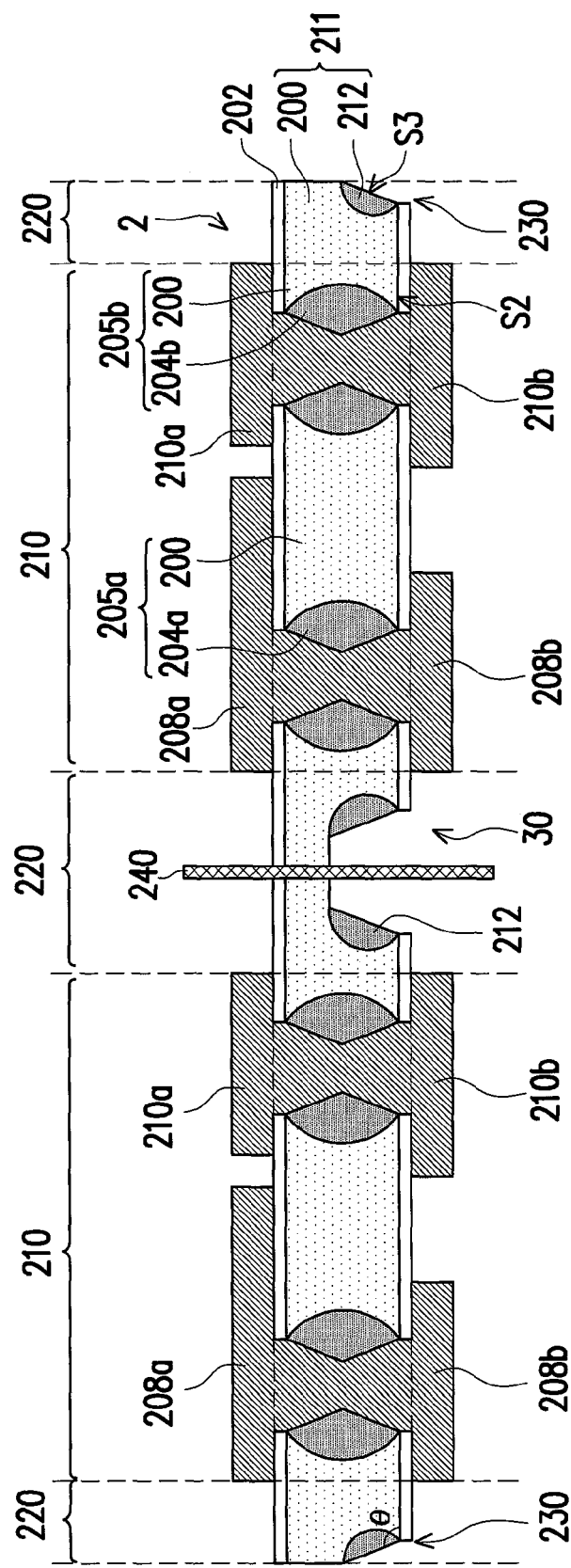
FIG. 4A is a cross-sectional view of a substrate according to a second embodiment of the present disclosure.
Figure 4B:
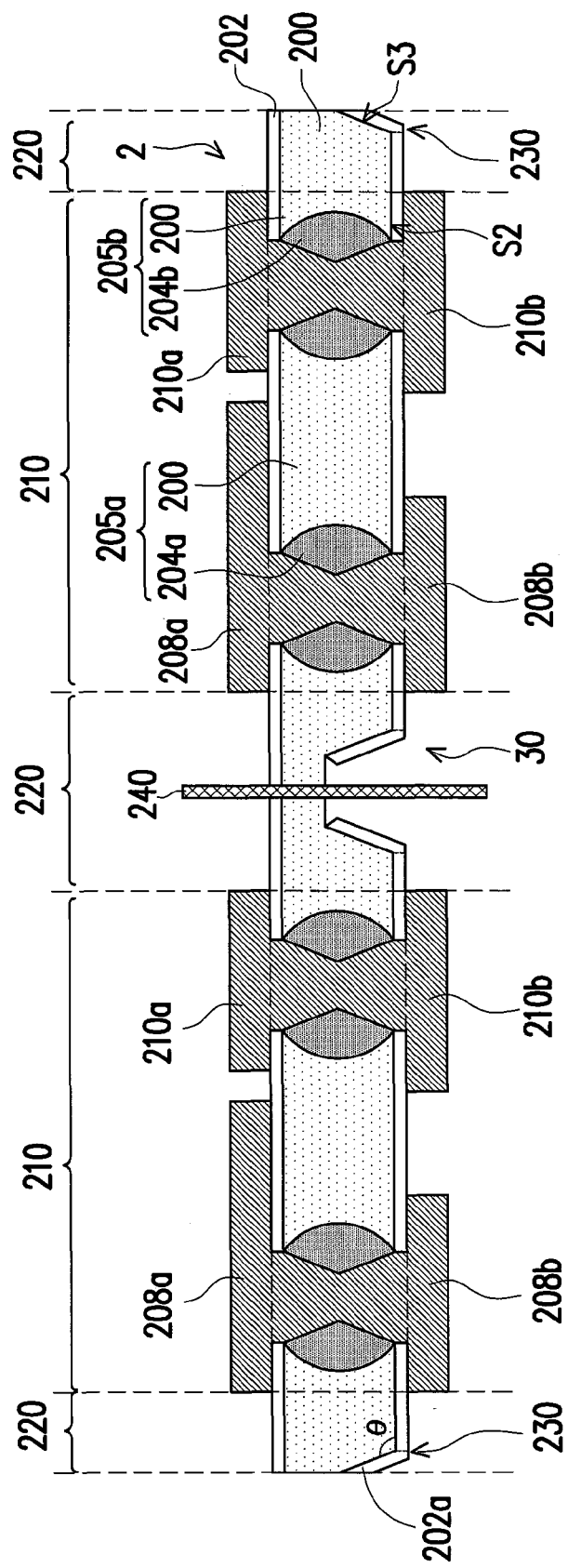
FIG. 4B is a cross-sectional view of another substrate according to the second embodiment of the present disclosure.

FIG. 4A is a cross-sectional view of a substrate according to a second embodiment of the present disclosure. FIG. 4B is a cross-sectional view of another substrate according to the second embodiment of the present disclosure.

Referring to FIG. 4A, a substrate 2 of the present embodiment is similar to the substrate 1 of FIG. 1E, and a difference between the two is that the substrate 2 of FIG. 4A includes a substrate material 200. The substrate material 200 includes a body portion 210 and an edge portion 220. The substrate material 220 is located at an edge of the body portion 210. The edge portion 220 is, for example, a scribe lane. The edge portion 220 has a lead angle 230, which is formed at a junction of a third surface S3 and the second surface S2. An included angle θ of the lead angle 230 is an obtuse angle. In an embodiment, the included angle θ of the lead angle may be, for example, 100 to 170 degrees. The lead angle 230 may be formed by cutting an opening 30 on a scribe lane 240 between each of the substrates 2, or formed by using a dry etching method or a wet etching method. In the subsequent packaging process, the included angle θ of the lead angle 230 being the obtuse angle can solve the problem of current leakage or short circuit of the electronic device due to second electrodes 208b and 210b being spilled to corners by excessive extrusion when bonding the substrate material 200 with a bump beneath. In an embodiment, a third doped region 212 of the second conductivity type may be further formed in a part of the substrate material 200 below the third surface S3, such that a diode 211 may be constituted by the third doped region 212 and a part of the substrate material 200 nearby. The diode 211 also has the function of a Zener diode for preventing occurrence of current leakage. However, the present disclosure is not limited thereto. In other embodiments, an insulation structure 202a (as shown in FIG. 4B) may also be formed on the third surface S3 of the substrate 2 by ways of spray coating or printing in order to prevent occurrence of current leakage. A material of the insulation structure 202a may be, fro example, a silicone.

Figure 5:
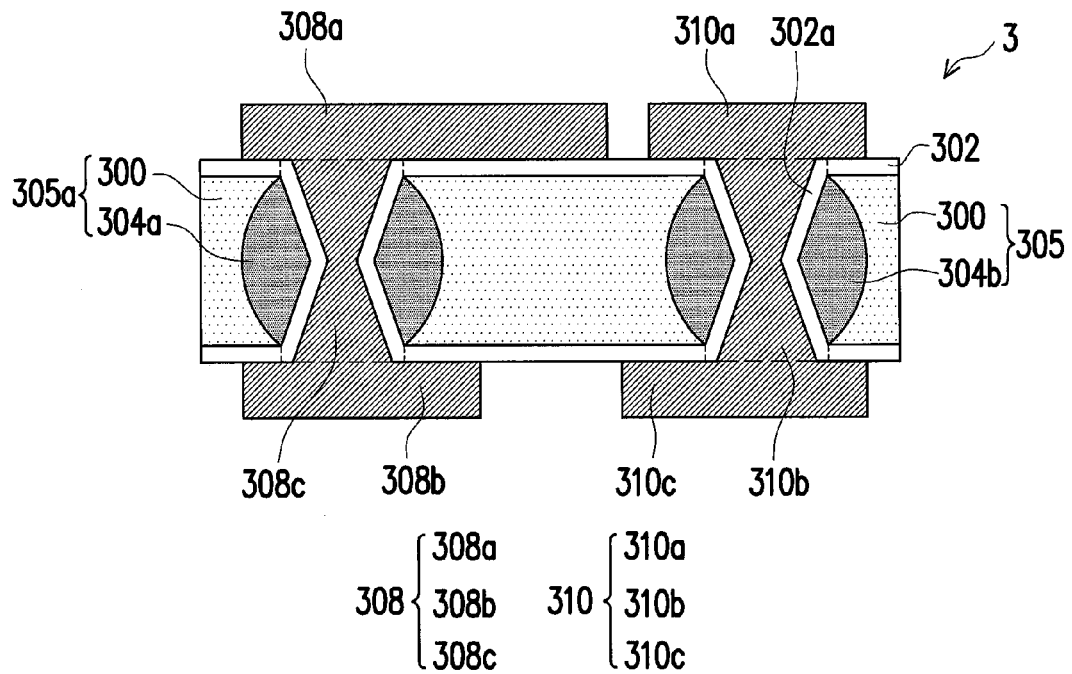
FIG. 5 is a cross-sectional view of a substrate according to a third embodiment of the present disclosure.

FIG. 5 is a cross-sectional view of a substrate according to a third embodiment of the present disclosure.

Referring to FIG. 5, a substrate 3 of the present embodiment is similar to the substrate 1 of FIG. 1E, and a difference between the two is that the substrate 3 of FIG. 5 further includes an insulation structure 302a disposed between a substrate material 300 and two sidewalls of connecting portions 308c and 310c. The insulation structure 302a is capable of preventing punch through by electrical charge. When the substrate material 300 of FIG. 5 is used as a submount, the electronic device can provide effectiveness of duplicate protection for preventing punch through by electrical charge and achieving ESD protection. In an embodiment, a material of the insulation structure 302a may be, for example, a silicon oxide, a silicon nitride, a silicon oxynitride or a combination thereof, and a forming method thereof includes a chemical vapor deposition. In an embodiment, a thickness of the insulation structure 302a is 100 nm to 3000 nm.

Figure 6:
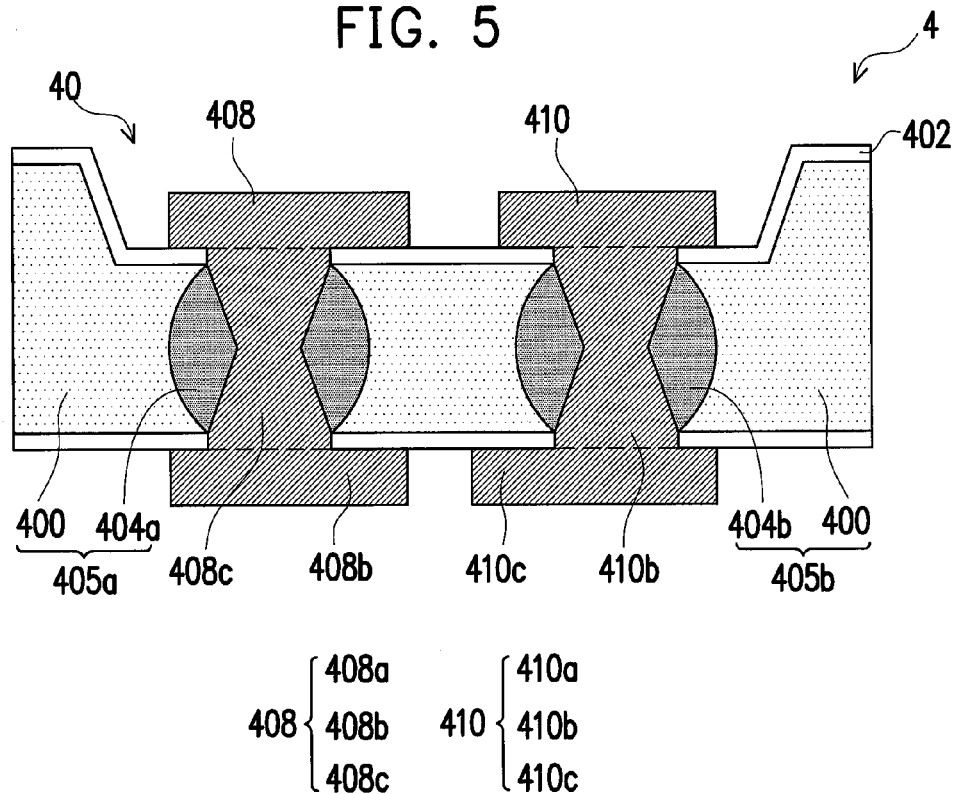
FIG. 6 is a cross-sectional view of a substrate according to a fourth embodiment of the present disclosure.

FIG. 6 is a cross-sectional view of a substrate according to a fourth embodiment of the present disclosure.

Referring to FIG. 6, a substrate 4 of the present embodiment is similar to the substrate 1 of FIG. 1E, and a difference between the two is that the substrate 4 of FIG. 6 includes a cavity 40. Diodes 405a and 405b are embedded in a substrate material 400 at a bottom portion of the cavity 40. Because the substrate material 400 of FIG. 6 has the cavity 40, when the substrate material 400 is used as a submount, a lateral light from a light-emitting diode device connected thereto may be reduced in addition to ESD protection. Accordingly, not only can a problem of yellowish halo be solved, an optical efficiency of the light-emitting diode device connected thereto may also be improved by coating a reflective mirror on a sidewall of the cavity 40.

Figure 7:
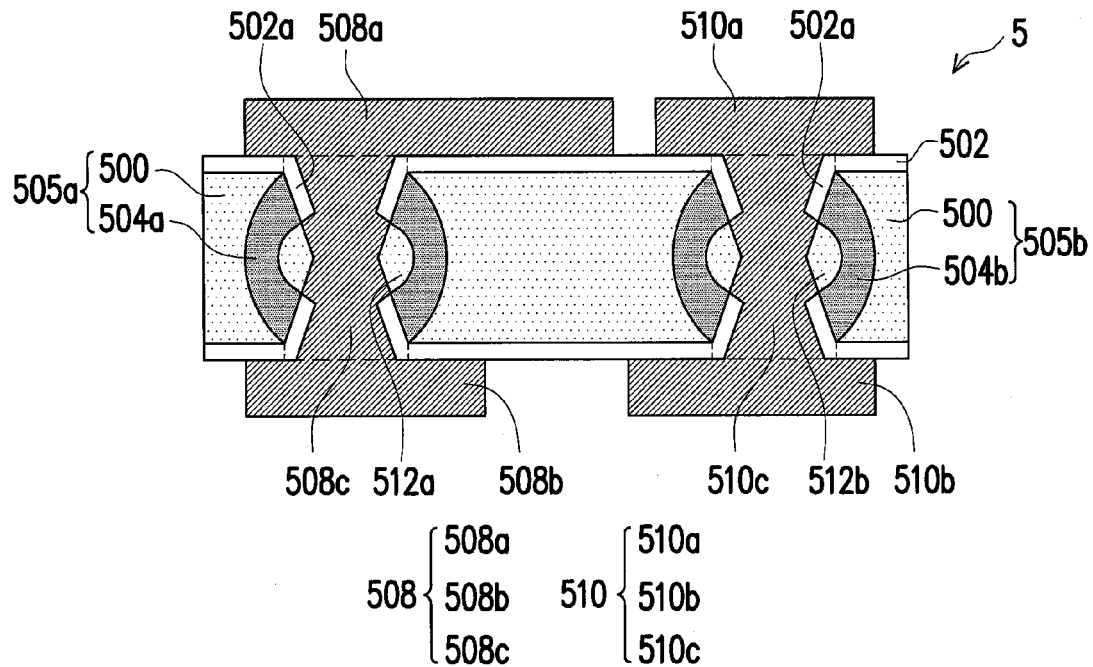
FIG. 7 is a cross-sectional view of a substrate according to a fifth embodiment of the present disclosure.

FIG. 7 is a cross-sectional view of a substrate according to a fifth embodiment of the present disclosure.

Referring to FIG. 7, a substrate 5 of the present embodiment is similar to the substrate 1 of FIG. 1E, and a difference between the two is that the substrate 5 of FIG. 7 includes second doped regions 512a and 512b. The second doped region 512a is located between the a first doped region 504a of the second conductivity type and a connecting portion 508c of a conductive structure 508. The second doped region 512b is located between the a first doped region 504b of the second conductivity type and a connecting portion 510c of a conductive structure 510. The second doped region 512a, the first doped region 504a and a substrate material 500 may compose a NPN structure or a PNP structure. The second doped region 512b, the first doped region 504b and the substrate material 500 may also compose the NPN structure or the PNP structure. A capability of resisting leakage current may be further enhanced by increasing junctions between the second doped region 512a and the first doped region 504a, and between the second doped regions 512b and the first doped region 504b. In addition, the substrate 5 of FIG. 7 further includes an insulation structure 502a covering on surfaces of the first doped regions 504a and 504b without covering on surfaces of the second doped regions 512a and 512b.

Figure 8:
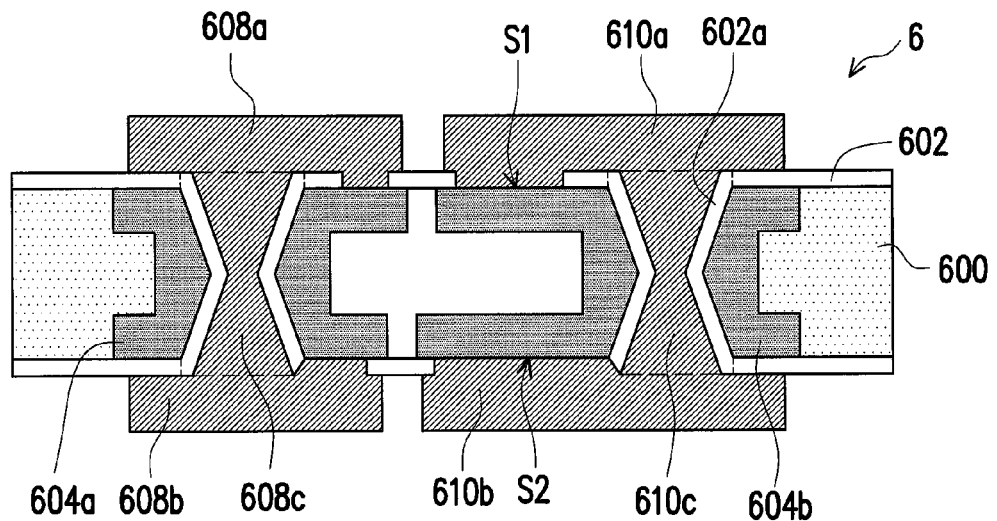
FIG. 8 is a cross-sectional view of a substrate according to a sixth embodiment of the present disclosure.

FIG. 8 is a cross-sectional view of a substrate according to a sixth embodiment of the present disclosure.

Referring to FIG. 8, a substrate 6 of the present embodiment is similar to the substrate 1 of FIG. 1E, and a difference between the two is that first doped regions 604a and 604b of the second conductivity type further extend to the first surface S1 and the second surface S2 of a substrate material 600 in FIG. 8. The first doped region 604a is located between a first electrode 608a and the substrate material 600 and between a second electrode 608b and the substrate material 600. The first doped region 604b is located between the first electrode 610a and the substrate material 600 and between the second electrode 610b and the substrate material 600. By increasing areas of the first doped regions 604a and 604b, the phenomenon of leakage current may be reduced.

In each of the foregoing embodiments of the present disclosure, a chip may be mounted on the substrate in order to form a package structure. In the following embodiments, the substrate of FIG. 1E is used for illustration. However, the present disclosure is not limited thereto. In other embodiments, the substrate material 100a of FIG. 1E may also be directly replaced by the substrate material in each of the foregoing embodiment, which is not repeated hereinafter.

Figure 9:
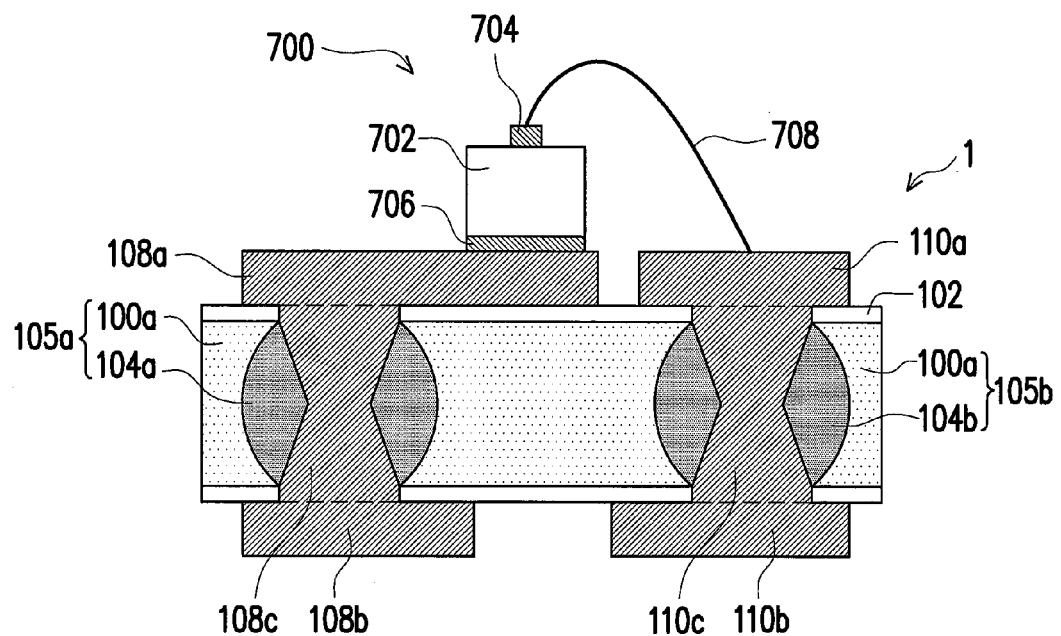
FIG. 9 illustrates a package structure according to an embodiment of the present disclosure.
Figure 10:
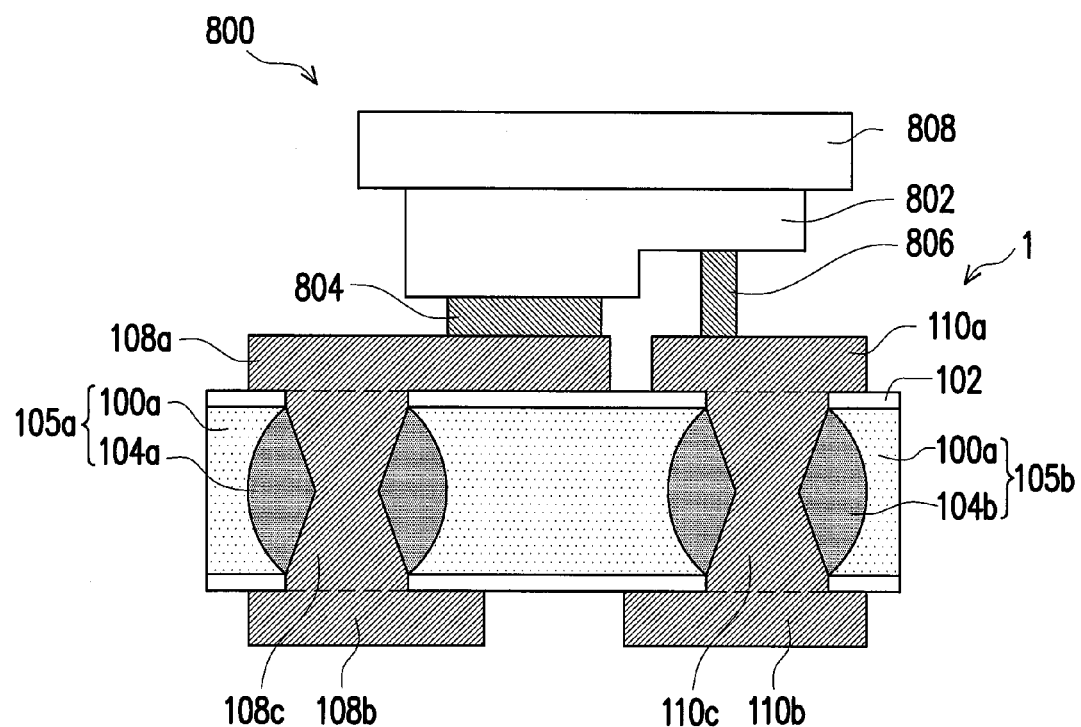
FIG. 10 illustrates a package structure according to another embodiment of the present disclosure.

FIG. 9 illustrates a package structure according to an embodiment of the present disclosure. FIG. 10 illustrates a package structure according to another embodiment of the present disclosure.

Referring to FIG. 1E, FIG. 9 and FIG. 10 together, a package structure according to an embodiment of the present disclosure includes the substrate 1 of FIG. 1E and chips 700 and 800. The chips 700 and 800 are respectively mounted on the substrate 1. The chips 700 and 800 may be a semiconductor chip, a light-emitting diode chip, a memory chip or a combination thereof. The substrate 1 may be electrically connected to the chips 700 and 800 by any method. A connecting method of the above includes, for example, a wire bonding, an eutectic bonding, a welding, a flip chip bonding and so on.

The package structure according to the embodiment of the present disclosure is illustrated by using the wire bonding and the flip chip bonding.

According to FIG. 9, a package structure according to an embodiment of the present disclosure includes the chip 700 and the substrate 1, and the substrate 1 and the chip 700 are electrically connected by the wire bonding. Specifically, a second lateral surface of a chip substrate 702 of the chip 700 is mounted on the substrate 1 through a chip bond paste 706, and electrically connected to the first electrode 108a of the conductive structure 108. A first lateral surface of the chip substrate 702 of the chip 700 electrically connects a pad 704 of the chip 700 to the first electrode 110a of the substrate 1 through a wire 708. In the embodiment of the present disclosure, the substrate 1 includes the diodes 105a and 105b of embedded in the substrate material 100a. Besides providing ESD protection, the embedded diodes 105a and 105b are also capable of reducing a volume of the package structure and thereby reducing manufacturing costs thereof.

According to FIG. 10, a package structure according to an embodiment of the present disclosure includes the chip 800 and the substrate 1, and the substrate 1 and the chip 800 are electrically connected by the flip chip bonding. Specifically, the chip 800 is mounted on the substrate 1. The chip 800 includes a transparent substrate 808 and a chip substrate 802. The transparent substrate 808 is located on a surface of a first side of the chip substrate 802. In an embodiment, the transparent substrate 808 may be a substrate made of sapphire, SiC, InP or GaN. The chip substrate 802 is electrically connected to the substrate 1 through a first bump 804 and a second bump 806 on a surface of a second side of the chip substrate 802. In an embodiment, the first bump 804 is disposed between the chip substrate 802 and the substrate 1 to electrically connect a P-type semiconductor layer (e.g., a P-type GaN) of the chip substrate 802 to the first electrode 108a of the substrate 1. The second bump 806 is located between the chip substrate 802 and the substrate 1 to electrically connect a N-type semiconductor layer (e.g., a N-type GaN) of the chip substrate 802 to the first electrode 110a of the substrate 1.

In summary, according to the embodiment of the present disclosure, by embedding the diode in the sidewall of the through hole of the substrate material, performance of ESD protection may be effectively improved to enhance a product reliability of the electronic device in addition to reduction of the volume of the package structure thereof. Moreover, by electrically connecting the embedded diode to a light-emitting diode, a light mixing effect of the light-emitting diode may be enhanced. Accordingly, the embodiments of the present disclosure are capable of reducing manufacturing costs while in line with the trend for creating the electronic device withcompact size.

Although the present disclosure has been described with reference to the above embodiments, it is apparent to one of the ordinary skill in the art that modifications to the described embodiments may be made without departing from the spirit of the present disclosure. Accordingly, the scope of the present disclosure will be defined by the attached claims not by the above detailed descriptions.

It will be apparent to those skilled in the art that various modifications and variations can be made to the disclosed embodiments. It is intended that the specification and examples be considered as exemplary only, with a true scope of the disclosure being indicated by the following claims and their equivalents.

The invention claimed is:

1. A substrate, comprising:
a substrate material of a first conductive type;
two conductive structures, respectively extending from a first surface of the substrate material to a second surface of the substrate material via two through holes penetrating through the substrate material, wherein each of the conductive structures comprises:
a first electrode, disposed on the first surface of the substrate material;
a second electrode, disposed on the second surface of the substrate material; and
a connecting portion, disposed between the first electrode and the second electrode to electrically connect the first electrode to the second electrode; and
at least one diode, embedded in the substrate material at a sidewall of one of the through holes, the at least one diode comprises a first doped region of a second conductivity type located in the substrate material at the sidewall of the one of the through holes, wherein the first doped region is in contact with at least a part of a sidewall of the connecting portion.

2. The substrate according to claim 1, further comprising a patterned insulation layer, disposed between the substrate material and the first electrodes and between the substrate material and the second electrodes.

3. The substrate according to claim 1, further comprising a second doped region of the first conductivity type, disposed between at least one of the first doped regions and the corresponding connecting portion.

4. The substrate according to claim 1, wherein a contour of the connecting portion comprises a hourglass shape, an I-shape, an inverse trapezoid shape, or a bow tie shape.

5. The substrate according to claim 1, wherein the substrate material comprises:
a body portion; and
an edge portion, and the edge portion being located at an edge of the body portion, wherein the edge portion has a lead angle, wherein the lead angle is formed at a junction of a third surface and the second surface, and the lead angle is an obtuse angle.

6. The substrate according to claim 5, further comprising a third doped region of the second conductivity type, disposed in the substrate material below the third surface of the edge portion.

7. The substrate according to claim 1, wherein the substrate material has a cavity, wherein the at least one diode is embedded in the substrate material at a bottom portion of the cavity.

8. A package structure having the substrate according to claim 1, and the package structure comprising:
a chip, disposed on the substrate, wherein the chip is electrically connected to the substrate.

9. The package structure according to claim 8, wherein the chip is electrically connected to the substrate through a wire or a bump.

10. The package structure according to claim 8, wherein the chip comprises a semiconductor chip, a light-emitting diode chip, a memory chip or a combination thereof.

11. A method of fabricating a substrate, comprising:
providing a substrate material of a first conductivity type;
forming two through holes in the substrate material, and each of the through holes penetrating through the substrate material;
embedding at least one diode in the substrate material exposed by one of the through holes, the at least one diode comprises a first doped region of a second conductivity type located in the substrate material at a sidewall of the one of the through holes; and forming two conductive structures in the substrate material, and the two conductive structures respectively extending from a first surface of the substrate material to a second surface of the substrate material via the two through holes penetrating through the substrate material, wherein the first doped region is in contact with at least a part of a sidewall of one of the conductive structures.

12. The method of fabricating the substrate according to claim 11, wherein a method of forming the conductive structures in the substrate material comprises:

forming at least two first electrodes on the first surface of the substrate material;

forming at least two second electrodes on the second surface of the substrate material; and forming a corresponding connecting portion in each of the through holes, and each of the connecting portions being electrically connected to the corresponding one of the at least two first electrodes and the corresponding one of the at least two second electrodes.

13. The method of fabricating the substrate according to claim 12, wherein the step of forming the through holes in the substrate material comprises:

forming a patterned insulation layer on the substrate material, and the patterned insulation layer having at least two groups of two corresponding openings; and performing an isotropic etching process on the substrate material between the openings by using the patterned insulation layer as a mask in order to remove a part of the substrate material.

14. The method of fabricating the substrate according to claim 13, wherein a method of embedding the at least one diode in the substrate material comprises:

after forming the through holes in the substrate material, performing a doping process on sidewalls of the through holes by using the patterned insulation layer as a mask in order to form the first doped region of the second conductivity type in another part of the substrate material.

15. The method of fabricating the substrate according to claim 11, wherein before embedding the at least one diode in the substrate material, the method further comprises: forming a cavity in the substrate material for embedding the at least one diode in the substrate material at a bottom portion of the cavity.

16. A substrate, comprising:

a substrate material of a first conductivity type;

two conductive structures, respectively extending from a first surface of the substrate material to a second surface of the substrate material via two through holes penetrating through the substrate material, wherein each of the conductive structures comprises:

a first electrode, disposed on the first surface of the substrate material;

a second electrode, disposed on the second surface of the substrate material; and a connecting portion, disposed between the first electrode and the second electrode to electrically connect the first electrode to the second electrode; and at least one diode, embedded in the substrate material at a sidewall of one of the through holes, the at least one diode comprises a first doped region of a second conductivity type located in the substrate material at the sidewall of the one of the through holes, wherein the first doped region further extends to the first surface and the second surface of the substrate material, and is located between the substrate material and the first electrode of the conductive structure connected to the first doped region and between the substrate material and the second electrode of the conductive structure connected to the first doped region.

* * * * *